(12) United States Patent
Sakamoto et al.

(10) Patent No.: US 8,791,170 B2
(45) Date of Patent: Jul. 29, 2014

(54) PHOTOCURABLE ORGANOPOLYSILOXANE COMPOSITION

(71) Applicant: Shin-Etsu Chemical Co., Ltd., Tokyo (JP)

(72) Inventors: Takafumi Sakamoto, Annaka (JP); Tadashi Araki, Annaka (JP); Masayuki Ikeno, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/644,774

(22) Filed: Oct. 4, 2012

(65) Prior Publication Data
US 2013/0090408 A1   Apr. 11, 2013

(30) Foreign Application Priority Data
Oct. 11, 2011   (JP) ................. 2011-223842

(51) Int. Cl.
| | |
|---|---|
| C03C 25/10 | (2006.01) |
| C08F 2/46 | (2006.01) |
| C08G 61/04 | (2006.01) |
| C08F 30/08 | (2006.01) |
| C08F 2/50 | (2006.01) |
| C08L 83/04 | (2006.01) |
| C08L 83/08 | (2006.01) |

(52) U.S. Cl.
CPC . C08F 30/08 (2013.01); *C08F 2/46* (2013.01); *C08F 2/50* (2013.01); *C08L 83/04* (2013.01); *C08L 83/08* (2013.01)
USPC .................. 522/172; 522/1; 520/1

(58) Field of Classification Search
CPC ............ C08F 30/08; C08F 2/46; C08F 2/50; C08L 83/04; C08L 83/08
USPC ......................... 522/172, 1; 520/1
See application file for complete search history.

(56) References Cited

U.S. PATENT DOCUMENTS

| | | | |
|---|---|---|---|
| 3,619,255 A * | 11/1971 | Lengnick | ............ 428/429 |
| 4,064,027 A | 12/1977 | Gant | |
| 4,675,346 A | 6/1987 | Lin et al. | |
| 5,391,677 A | 2/1995 | Arai et al. | |
| 2003/0031958 A1 | 2/2003 | Tohge et al. | |

FOREIGN PATENT DOCUMENTS

| | | |
|---|---|---|
| EP | 0 539 234 A2 | 4/1993 |
| EP | 0 610 629 A2 | 8/1994 |
| EP | 2 151 480 A1 | 2/2010 |
| GB | 1323869 | 7/1973 |
| JP | 52-40334 | 10/1977 |
| JP | 53-36515 | 10/1978 |
| JP | 60-104158 A | 6/1985 |
| JP | 60-215009 A | 10/1985 |
| JP | 2647285 B2 | 8/1997 |
| JP | 2001-240620 A | 9/2001 |

OTHER PUBLICATIONS

Watanabe, Akira and Tokuji Miyashita, "Micropatterning of Organic-Inorganic Hybrid Film Using Photosensitive Sol-gel System Consisting of Double-decker-shaped Multifunctional Silesquioxane", 2006, The Chemical Society of Japan, Chemistry Letters, vol. 35, No. 10, 1130-1131.*
Extended European Search Report issued in European Patent Application No. 12187669.2-2115 on Feb. 5, 2013.
Watanabe et al., "Micropatterning of Organic-Inorganic Hybrid Fillm Using Photosensitive Sol-Gel system Consisting of Double-decker-shaped Multifunctional Silsesquioxane", Chemistry Letters vol. 35, No. 10, (2006), pp. 1130-1131.

* cited by examiner

*Primary Examiner* — Ling Choi
*Assistant Examiner* — Jessica E Whiteley
(74) *Attorney, Agent, or Firm* — Birch, Stewart, Kolasch & Birch, LLP

(57) ABSTRACT

Disclosed is a photocurable organopolysiloxane composition including (A) 100 parts by weight of diorganopolysiloxane having at least two silicon atoms having a hydroxyl group and/or hydrolyzable group attached thereto in one molecule; and (B) 0.1 to 30 parts by weight of a complex compound composed of titanium(meth)acrylate-trialkoxide and β-diketone. It will find use as a sealing agent, adhesive, coating material. It is particularly suitable for micro pars and precision molding on account of its good curability and very little cure shrinkage.

12 Claims, No Drawings

PHOTOCURABLE ORGANOPOLYSILOXANE COMPOSITION

CROSS-REFERENCE TO RELATED APPLICATION

This non-provisional application claims priority under 35 U.S.C. §119(a) on Patent Application No. 2011-223842 filed in Japan on Oct. 11, 2011, the entire contents of which are hereby incorporated by reference.

TECHNICAL FIELD

The present invention relates to a photocurable organopolysiloxane composition excellent in photocurability and capable of curing at room temperature which will find use as a sealing agent, adhesive, coating material. More particularly, the present invention relates to a photocurable organopolysiloxane composition which does not need any special photofunctional organopolysiloxane.

BACKGROUND ART

It is a well-known fact that an organopolysiloxane turns into a silicone rubber excelling in heat resistance, cold resistance, weather resistance, and electrical properties by heating in the presence of an organic peroxide or by hydrosilylation reaction. It is also known well that the silicone rubber can be obtained as the result of curing at room temperature by condensation reaction.

On the other hand, there is known an organopolysiloxane that cures upon irradiation with light in the presence of a photoinitiator.

A UV (ultraviolet)-curable organopolysiloxane composition is disclosed in JP-B S52-40334 and JP-A S60-104158 (Patent Documents 1 and 2). The composition includes a vinyl group-containing polysiloxane and a mercapto group-containing polysiloxane and forms a cured product through photo-radical addition reaction. Another example is disclosed in JP-B S53-36515, JP-A S60-215009, and JP 2647285 (Patent Documents 3 to 5). It is a photocurable organopolysiloxane composition including an acrylic group-containing polysiloxane and a sensitizer and forms a cured product upon irradiation with light.

Unfortunately, the above-mentioned composition containing a vinyl group-containing polysiloxane and a mercapto group-containing polysiloxane involves a problem with odor due to mercapto groups and corrosion on metal. Consequently, they are limited in applications.

The above-mentioned composition containing an acrylic group-containing polysiloxane and a sensitizer also suffers the disadvantage of requiring a high-molecular-weight linear polysiloxane as the acrylic group-containing polysiloxane for production of a rubbery elastic product. The higher the molecular weight the linear polysiloxane has, the less becomes the amount of the terminal acrylic group. This leads to poor curability. Another disadvantage is that the surface of the composition that is in contact with air cures very little due to inhibitive action by air. Thus, the compositions of this kind are not in practical use except for the one which contains a polysiloxane with a comparatively large content of acrylic groups and gives rise to a resinous cured product. None of them practically give rise to rubbery elastic products.

Moreover, the mercapto group-containing polysiloxane and the acrylic group-containing polysiloxane need a special synthetic route for their production. The resulting products are usually regarded as new chemical substances which are subject to legal regulations and disadvantageous costwise.

The photocurable organopolysiloxane composition is advantageous in workability compared with the one of condensation type, heat-curable type, and addition reaction type using a platinum catalyst on account of its ability to cure in a short time upon UV irradiation. However, the resulting product (silicone rubber elastomer) obtained in this manner is poor in tensile strength and storage stability, which limits its applications.

Another technology in the past is concerned with the use of a complex compound composed of titanium-(meth)acrylate-trialkoxide and β-diketone for micropatterning of an organic-inorganic hybrid thin film of photosensitive sol-gel system which is formed from polyfunctional silsesquioxane of double-decker type, as disclosed in Chemistry Letters Vol. 35, No. 10 (2006), pp. 1130-1131 (Non-Patent Document 1).

It is disclosed that the complex compound functions as an adhesion promoter that improves adhesion to the coating film when incorporated into the high-solid acrylic resin composition (see JP-A 2001-240620 (Patent Document 6)). This disclosure, however, suggests nothing about its application as a curing catalyst.

Citation List
Patent Document 1: JP-B S52-40334
Patent Document 2: JP-A S60-104158
Patent Document 3: JP-B S53-36515
Patent Document 4: JP-A S60-215009
Patent Document 5: JP 2647285
Patent Document 6: JP-A 2001-240620
Non-Patent Document 1: Chemistry Letters Vol. 35, No. 10 (2006), pp. 1130-1131

SUMMARY OF INVENTION

It is an object of the present invention to provide a photocurable organopolysiloxane composition which is free from the above-mentioned disadvantages of conventional photocurable organopolysiloxane composition and capable of photocuring by UV irradiation without the necessity for any special photofunctional organopolysiloxane, thereby giving rise to a cured product excelling in rubbery characteristics.

As the result of extensive investigation to address the above problems, the present inventors have found that by incorporating a complex compound composed of titanium-(meth)acrylate-trialkoxide and β-diketone into a photocurable organopolysiloxane composition, catalytic activity increases upon UV irradiation, resulting in an excellent curability of the photocurable organopolysiloxane composition. This finding led to the present invention.

The present invention covers the following photocurable organopolysiloxane composition.

[1] A photocurable organopolysiloxane composition comprising:
(A) 100 parts by weight of a diorganopolysiloxane having at least two silicon atoms having a hydroxyl group and/or hydrolyzable group attached thereto in one molecule; and
(B) 0.1 to 30 parts by weight of a complex compound composed of titanium-(meth)acrylate-trialkoxide and β-diketone.

[2] The photocurable organopolysiloxane composition of [1], wherein the complex compound composed of titanium-(meth)acrylate-trialkoxide and β-diketone of component (B) is a complex compound which is represented by the formula (3) below:

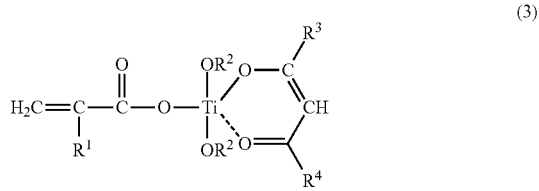

(3)

wherein $R^1$ is a hydrogen atom or methyl group; $R^2$ and $R^3$ each are an unsubstituted or substituted monovalent hydrocarbon group having 1 to 12 carbon atoms; and $R^4$ is an unsubstituted or substituted monovalent hydrocarbon group having 1 to 12 carbon atoms or an alkoxyl group having 1 to 8 carbon atoms.

[3] The photocurable organopolysiloxane composition of [2], wherein the complex compound composed of titanium-(meth)acrylate-trialkoxide and β-diketone of component (B) is a complex compound which is composed of titanium-(meth)acrylate-triisopropoxide and benzoylacetone.

[4] The photocurable organopolysiloxane composition of any one of [1] to [3], wherein component (A) is a diorganopolysiloxane having its molecular chain blocked with hydroxyl groups and/or hydrolyzable groups at both ends.

[5] The photocurable organopolysiloxane composition of [4] wherein component (A) is a diorganopolysiloxane having the following formula (1) or (2):

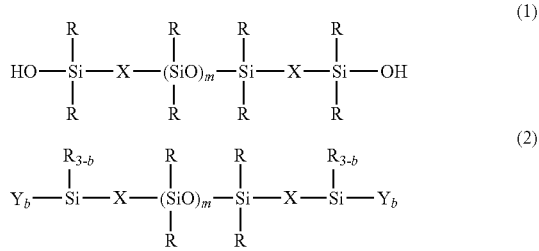

wherein R is an unsubstituted or substituted monovalent hydrocarbon group having 1 to 12 carbon atoms; X is an oxygen atom or a divalent hydrocarbon group having 1 to 8 carbon atoms; Y is a hydrolysable group; b is 2 or 3; and m is a number satisfying that the diorganopolysiloxane has a viscosity of 100 to 1,000,000 mPa·s at 25° C.

[6] The photocurable organopolysiloxane composition of any one of [1] to [5], which further comprises a silane having at least two hydrolysable groups in one molecule and/or its partial hydrolyzate condensate as component (C).

[7] The photocurable organopolysiloxane composition of any one of [1] to [6], which further comprises a photoinitiator as component (D).

ADVANTAGEOUS EFFECTS OF INVENTION

The photocurable organopolysiloxane composition according to the present invention will find use as sealing agent, adhesive, and coating material in the application area of micro parts and precision molding on account of its good curability and very little cure shrinkage.

DESCRIPTION OF EMBODIMENTS

The invention will be described below in more detail.

The photocurable organopolysiloxane composition according to the present invention contains:

component (A) in an amount of 100 parts by weight which is a diorganopolysiloxane having at least two silicon atoms having a hydroxyl group and/or hydrolyzable group attached thereto in one molecule;

component (B) in an amount of 0.1 to 30 parts by weight which is a complex compound composed of titanium-(meth)acrylate-trialkoxide and β-diketone; and optionally component (C) which is a silane having at least two hydrolysable groups in one molecule and/or its partial hydrolyzate condensate; and/or component (D) which is a photoinitiator.

Component (A)

Component (A) is a diorganopolysiloxane having at least two silicon atoms having a hydroxyl group and/or hydrolyzable group attached thereto in one molecule. This component is the base polymer of the photocurable organopolysiloxane composition according to the present invention. It has in its molecule at least two hydroxyl groups or hydrolysable groups attached to silicon atoms. It may be of linear type, branched type, or resinous type. The linear one is preferable. A typical example of the diorganopolysiloxane is represented by formula (1) or (2) below which has its molecule blocked with a hydroxyl group or hydrolysable group at each end:

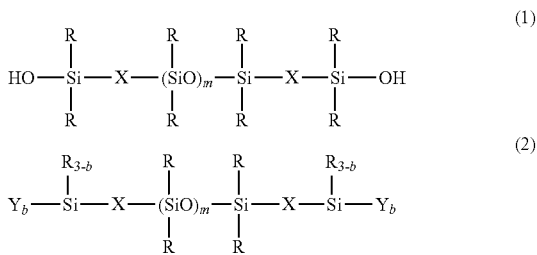

wherein R is an unsubstituted or substituted monovalent hydrocarbon group having 1 to 12 carbon atoms; X is an oxygen atom or a divalent hydrocarbon group having 1 to 8 carbon atoms; Y is a hydrolysable group; b is 2 or 3; and m is a number satisfying that the diorganopolysiloxane has a viscosity of 100 to 1,000,000 mPa·s at 25° C.

In the formulae above, the unsubstituted or substituted monovalent hydrocarbon group represented by R is exemplified by alkyl groups (such as methyl group, ethyl group, propyl group, butyl group, pentyl group, hexyl group, heptyl group, octyl group, nonyl group, decyl group, and octadecyl group), cycloalkyl groups (such as cyclopentyl group and cyclohexyl group), alkenyl groups (such as vinyl group, allyl group, butenyl group, pentenyl group, and hexenyl group), aryl groups (such as phenyl group, tolyl group, xylyl group, α-naphthyl group, and β-naphthyl group), aralkyl groups (such as benzyl group, 2-phenylethyl group and 3-phenyipropyl group), and any one of the foregoing groups which has its hydrogen atoms partly or entirely replaced by a halogen atom (such as F, Cl, and Br) or a cyano group, as exemplified by 3-chloropropyl group, 3,3,3-trifluoropropyl group, and 2-cyanoethyl group. Preferable among these groups are methyl group, ethyl group, and phenyl group, with methyl group being most desirable.

In the formulae above, X is an oxygen atom or a $C_{1-8}$ divalent hydrocarbon group such as an alkylene group. The latter is represented by —$(CH_2)_p$— where p is 1 to 8. Preferable among them is an oxygen atom or —$CH_2CH_2$—.

In the formulae above, Y is a hydrolysable group at both ends of the molecular chain of the diorganopolysiloxane. It is exemplified by alkoxyl groups (such as methoxy group, ethoxy group, and propoxy group), alkoxyalkoxy groups (such as methoxyethoxy group, ethoxyethoxy group, and methoxypropoxy group), acyloxy groups (such as acetoxy group, octanoyloxy group, and benzoyloxy group), alkenyloxy groups (such as vinyloxy group, isopropenyloxy group, and 1-ethyl-2-methylvinyloxy group), ketoxime groups (such as dimethylketoxime group, methylethylketoxime group, and diethylketoxime group), amino groups (such as dimethylamino group, diethylamino group, butylamino group, and cyclohexylamino group), aminoxy groups (such as dimethylaminoxy group and diethylaminoxy group), and amide groups (such as N-methylacetamide group, N-ethylacetamide group, and N-methylbenzamide group). Preferable among these groups are alkoxyl groups, and methoxy group and ethoxy group are more desirable and methoxy group is particularly desirable.

The diorganopolysiloxane as component (A) should be one which has a viscosity (at 25° C.) of 100 to 1,000,000 mPa·s, preferably 300 to 500,000 mPa·s, more preferably 500 to 100,000 mPa·s, and particularly 1,000 to 80,000 mPa·s. With an excessively low viscosity, the resulting composition will not give a cured product excelling in physical properties and mechanical strength. With an excessively high viscosity, the resulting composition will be poor in workability. Incidentally, the viscosity is measured by using a rotational viscometer.

The diorganopolysiloxane as component (A) is exemplified below:

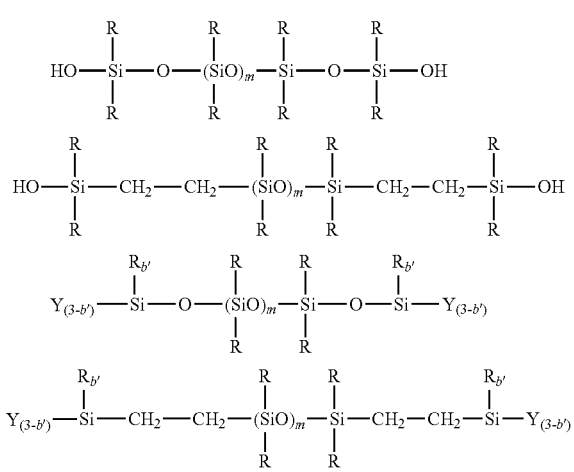

wherein m, R, and Y are defined as above, and b' is 0 or 1.

The diorganopolysiloxane as component (A) may be used alone or in combination with at least two homologues thereof differing in structure and molecular weight.

Component (B)

Component (B) is a complex compound composed of titanium-(meth)acrylate-trialkoxide and β-diketone, which is an essential component giving curability to the composition of the present invention and is represented by the formula (3) below:

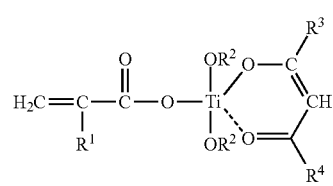

wherein $R^1$ is a hydrogen atom or methyl group; $R^2$ and $R^3$ each are an unsubstituted or substituted monovalent hydrocarbon group having 1 to 12 carbon atoms; and $R^4$ is an unsubstituted or substituted monovalent hydrocarbon group having 1 to 12 carbon atoms or an alkoxyl group having 1 to 8 carbon atoms.

$R^2$, $R^3$, and $R^4$ are the same substituents as R defined above. Preferred examples of $R^2$ include methyl group, ethyl group, n-propyl group, isopropyl group, n-butyl group, t-butyl group, and 2-ethylhexyl group. Preferred examples of $R^3$ include methyl group, ethyl group, n-propyl group, isopropyl group, n-butyl group, t-butyl group, 2-ethylhexyl group, and benzyl group. Preferred examples of $R^4$ include methyl group, ethyl group, n-propyl group, isopropyl group, n-butyl group, t-butyl group, 2-ethylhexyl group, methoxy group, and ethoxy group.

The component (B) may be synthesized by the following step, which is given as a mere example.

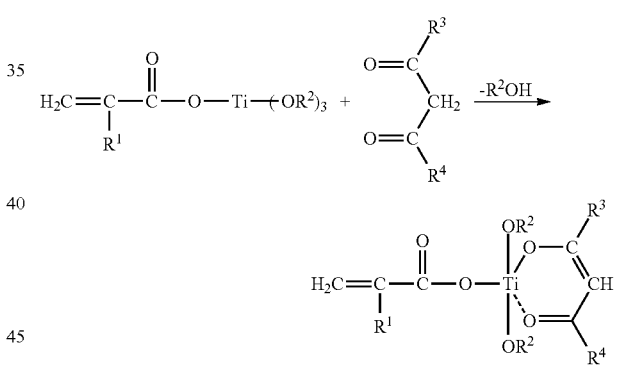

The synthesis illustrated above is accomplished by mixing a solution of titanium-methacrylate-triisopropoxide in THF (tetrahydrofuran) with a solution of benzoylacetone in THF at room temperature. This process rapidly gives rise to a complex compound as the desired product.

Typical examples of the complex compound are shown below, in which iPr stands for isopropyl group and Ph stands for phenyl group.

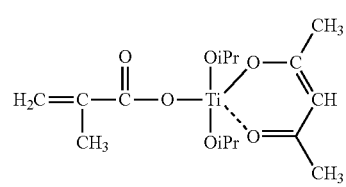

-continued

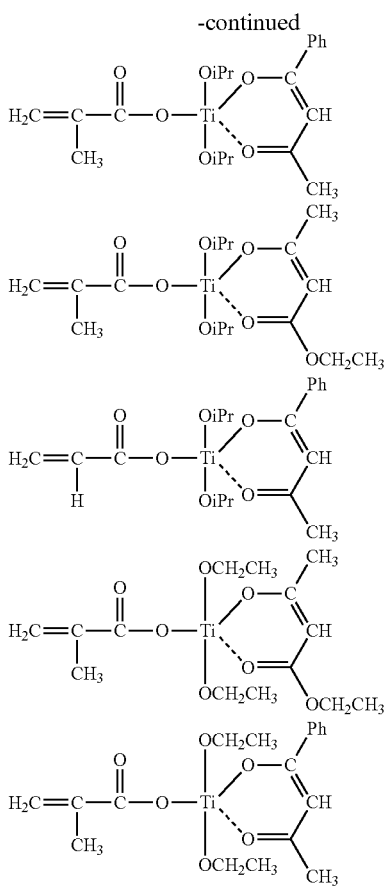

The amount of component (B) for 100 parts by weight of component (A) should be 0.1 to 30 parts by weight, preferably 0.5 to 20 parts by weight, more preferably 1 to 15 parts by weight. With component (B) in an amount less than 0.1 parts by weight or more than 30 parts by weight, the resulting composition is poor in curability and unable to give a cured product with good resilience. An adequate amount ranges from 0.1 to 30 parts by weight.

The composition according to the present invention should optionally be incorporated with a silane having at least two hydrolysable groups in one molecule and/or a condensate of partial hydrolyzate thereof as component (C). Component (C) effectively improves the curability of the composition of the present invention. It should have at least two hydrolysable groups bonded to silicon atoms in one molecule. A typical example of such an organosilicon compound is a silane or a condensate of partial hydrolyzate thereof, which is represented by the formula below:

wherein R is defined as above, Z independently denotes a hydrolyzable group, and a is an integer of 0 to 2.

The hydrolyzable group (Z) may be the same one as the hydrolyzable group (Y). Preferable among those hydrolyzable groups mentioned above are alkoxyl groups, ketoxime groups, and isopropenoxy groups, particularly ketoxime groups.

Component (C), which is a silane or a condensate of partial hydrolyzate thereof, should essentially have at least two hydrolyzable groups in one molecule as mentioned above, without any other restrictions. It should preferably have at least three hydrolyzable groups. The silicon atom in component (C) may have any other groups than hydrolyzable groups attached thereto. Moreover, it may have the molecular structure of silane or siloxane. The siloxane structure may be linear, branched, or cyclic.

The group (R) mentioned above, which excludes hydrolyzable groups, may be an unsubstituted or substituted monovalent hydrocarbon group having 1 to 12 carbon atoms, preferably 1 to 8 carbon atoms, as exemplified below: alkyl groups (such as methyl group, ethyl group, propyl group, butyl group, pentyl group, and hexyl group); cycloalkyl groups (such as cyclopentyl group and cyclohexyl group); aryl groups (such as phenyl group and tolyl group); aralkyl groups (such as benzyl group and 2-phenylethyl group); alkenyl groups (such as vinyl group, allyl group, butenyl group, pentenyl group, and hexenyl group); and halogenated alkyl groups (such as 3,3,3-trifluoropropyl group and 3-chloropropyl group). Preferable among these groups are methyl group, ethyl group, propyl group, phenyl group, and vinyl group.

According to the present invention, component (C) is an organosilicon compound exemplified below: ethyl silicate, propyl silicate, methyltrimethoxysilane, methyltriethoxysilane, vinyltrimethoxysilane, vinyltriethoxysilane, methyltris(methoxyethoxy)silane, vinyltris(methoxyethoxy)silane, methyltripropenoxysilane, methyltriacetoxysilane, vinyltriacetoxysilane, methyltri(methylethylketoxime)silane, vinyltri(methylethylketoxime)silane, phenyltri(methylethylketoxime)silane, propyltri(methylethylketoxime)silane, tetra(methylethylketoxime)silane, 3,3,3-trifluoropropyltri(methylethylketoxime)silane, 3-chloropropyltri(methylethylketoxime)silane, methyltri(dimethylketoxime)silane, methyltri(diethylketoxime)silane, methyltri(methylisopropylketoxime)silane, tri(cyclohexanoxime)silane, and condensate of partial hydrolyzate thereof. Preferable among these examples are methyltri(methylethylketoxime)silane, vinyltri(methylethylketoxime)silane, phenyltri(methylethylketoxime)silane, propyltri(methylethylketoxime)silane, tetra(methylethylketoxime)silane, 3,3,3-trifluoropropyltri(methylethylketoxime)silane, methyltri(dimethylketoxime)silane, methyltri(diethylketoxime)silane, methyltri(methylisopropylketoxime)silane, and tri(cyclohexanoxime)silane.

They may be used alone or in combination with one another.

The amount of component (C) for 100 parts by weight of component (A) should be 0.1 to 30 parts by weight, preferably 0.5 to 20 parts by weight, more preferably 1 to 15 parts by weight. An amount less than 0.1 parts by weight is too small for component (C) to produce its effect. With component (C) in an amount more than 30 parts by weight, the resulting composition will have an excessive large cure shrinkage and will give a cured product poor in resilience.

The composition of the present invention should preferably be incorporated with a photoinitiator known well in the industry as component (D).

Examples of the photoinitiator are acetophenone, propiophenone, benzophenone, xanthone, fluoran, benzaldehyde, anthraquinone, triphenylamine, carbazole, 3-methylacetophenone, 4-methylacetophenone, 3-pentylacetophenone, 4-methoxyacetophenone, 2,2-diethoxyacetophenone, 3-bromoacetophenone, 4-allylacetophenone, p-diacetylbenzene, 3-methoxybenzophenone, 4-methylbenzophenone, 4-chlorobenzophenone, 4,4-dimethoxybenzophenone, 4-chloro-4-benzylbenzophenone, 3-chloroxanthone, 3,9-dichloroxanthone, 3-chloro-8-nonylxanthone, benzoin, benzoin methyl ether, benzoin butyl ether, bis(4-dimethylaminophenol)ketone, benzylmethoxyketal, and 2-chlorothioxanthone. The amount of component (D) should preferably be 0.01 to 5 parts by weight for 100 parts by weight of component (A).

The composition of the present invention may be additionally incorporated with any known additive and filler in an amount not harmful to the effect of the present invention.

Cure Accelerator

The composition of the present invention may be incorporated with one or more accelerators for condensation reaction.

Their examples include the following: tin catalysts (such as tin dioctoate, dimethyltin diversatate, dibutyldimethoxy tin, dibutyltin diacetate, dibutyltin dioctoate, dibutyltin dilaurate, dibutyltin dibenzylmaleate, dioctyltin dilaurate, and tin chelate), strongly basic compounds (such as guanidine and DBU (1,8-diazabicyclo[5.4.0]-7-undecene) and those compounds containing them including alkoxysilanes, titanate esters (such as tetraisopropoxytitanium, tetra-n-butoxytitanium, tetrakis (2-ethylhexoxy)titanium, dipropoxybis(acetylacetona)titanium, and titanium isopropoxyoctyleneglycol), and titanium chelate compounds. The amount of the accelerator should preferably be 0.001 to 20 parts by weight, particularly 0.01 to 10 parts by weight, for 100 parts by weight of component (A).

Adhesion Promoter

Another optional additive is any silane coupling agent of amine type as exemplified below: γ-aminopropyltrimethoxysilane, γ-aminopropyltriethoxysilane, γ-aminopropylmethyldimethoxysilane, γ-aminopropylmethyldiethoxysilane, ethylenediaminopropyltrimethoxysilane, ethylenediaminopropyltriethoxysilane, ethylenediaminopropylmethyldimethoxysilane, ethylenediaminopropylmethyldiethoxysilane, and α-aminopropyltrimethoxysilane.

Although an organic amine having a primary amino group may be used as an organic compound, because of its corrosiveness and odor, it is desirable to use it in the form of polymer or oligomer containing a primary amino group or a silane coupling agent (or a partial hydrolyzate thereof) containing a primary amino group as a functional group. The amount of the adhesion promoter should preferably be 0.1 to 20 parts by weight for 100 parts by weight of component (A).

Other Components

The composition of the present invention may be incorporated with other components (such as known additives for room temperature curable organopolysiloxane compositions) than mentioned above. They typically include reinforcing fillers (such as fumed silica, wet silica, precipitated silica, and calcium carbonate), metal oxides (such as aluminum oxide and zinc oxide), metal hydroxide, carbon black, glass beads, glass balloons, resin beads, and resin balloons, which may or may not have ordinary surface treatment. Additional examples include polyether (as a thixotropy improver), isoparaffin (as a plasticizer), and network polysiloxane composed of trimethylsiloxane units and SiO$_2$ units (as a crosslink density improver). Further additional examples include colorants (such as pigment, dye, and fluorescent whitening agent), physiologically active substances (such as fungicide, antibacterial agent, cockroach repellent, and marine organism repellent), and surface improvers (such as organic liquid incompatible with silicone).

The composition may also be diluted for improvement in coatability. Diluents for this purpose include organic solvents (such as toluene, xylene, solvent gasoline, cyclohexane, methylcyclohexane, and low-boiling isoparaffin), and volatile silanes and siloxanes.

Curing Method

The photocurable organopolysiloxane composition according to the present invention can be cured by ultraviolet irradiation. The UV light should preferably be near ultraviolet light with a wavelength ranging from 10 to 400 nm, particularly 200 to 380 nm, although not specifically restricted. A well known high-pressure mercury metal halide lamps can be used. The amount of irradiation should preferably be 100 to 10,000 mJ/cm$^2$ for the high-pressure mercury metal halide lamps, although not specifically restricted.

Curing can be accomplished at room temperature within several seconds to one week.

Applications of the Composition

The photocurable organopolysiloxane composition according to the present invention will find use as a sealing agent, adhesive, coating material. It is capable of firm bonding to substrates.

EXAMPLES

The following is the detailed description of the present invention which illustrates Synthesis Example, Examples, and Comparative Examples, without any intention to restrict the scope of the present invention. Incidentally, the viscosity given in the following examples is one which was measured at 25° C. with a rotational viscometer.

Synthesis Example

A solution was prepared which contains 3.02 g of titanium-methacrylate-triisopropoxide in 2 g of THF (tetrahydrofuran). It was a light-yellowish transparent liquid. Another solution was prepared which contains 1.63 g of benzoylacetone in 2.5 g of THF. The two solutions were mixed together at room temperature. They rapidly turned into an orange transparent liquid containing a complex which is the compound (A) represented by the formula below.

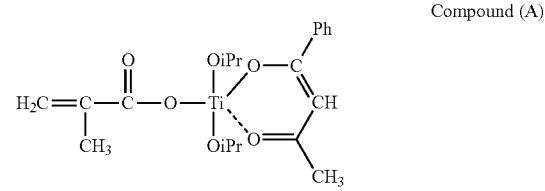

Compound (A)

Example 1

A composition was prepared by uniform mixing from 100 parts by weight of dimethylpolysiloxane (blocked with hydroxyl groups at both ends) having a viscosity of 700 mPa·s and 4 parts by weight of the compound (A) in the form of solution in THF.

Example 2

A composition was prepared by uniform mixing from the composition obtained in Example 1 and 3 parts by weight of methyltrimethoxysilane.

Example 3

A composition was prepared by uniform mixing from the composition obtained in Example 1 and 0.3 parts by weight of 2,2-diethoxyacetophenone.

Comparative Example 1

A composition was prepared in the same manner as in Example 1 except that the compound (A) was not added.

Comparative Example 2

A composition was prepared in the same manner as in Example 1 except that the compound (A) was replaced by 1.6 parts by weight of benzoylacetone.

Comparative Example 3

A composition was prepared in the same manner as in Example 1 except that the compound (A) was replaced by 3.02 parts by weight of titanium-methacrylate-triisopropoxide.

Method for Evaluation

Each sample of the composition prepared as mentioned above was placed in a cylindrical glass dish (measuring about 30 mm in inside diameter and about 20 mm in depth). Then, it was cured by irradiation with ultraviolet light under the following conditions.

UV source: one high-pressure mercury lamp (80 W/cm)
Distance: 10 cm
Speed of transfer: 1 m/min (3 times), 1,500 mJ/cm$^2$ The state of curing was observed and the result was indicated in terms of the volume of cured portion (percentage), as shown in Table 1.

TABLE 1

|  | Example | | | Comparative Example | | |
|---|---|---|---|---|---|---|
|  | 1 | 2 | 3 | 1 | 2 | 3 |
| State of curing | 85 | 90 | 90 | 0 | 0 | 20 |

Japanese Patent Application No. 2011-223842 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photocurable organopolysiloxane composition comprising:
   (A) 100 parts by weight of a diorganopolysiloxane having at least two silicon atoms having a hydroxyl group and/or hydrolyzable group attached thereto in one molecule;
   (B) 0.1 to 30 parts by weight of a complex compound, composed of titanium-(meth)acrylate-trialkoxide and b-diketone, represented by formula (3):

$$H_2C=C(R^1)-C(=O)-O-Ti(OR^2)_2 \cdots \text{(complex with } R^3-C(O\cdots)=CH-C(=O\cdots)-R^4 \text{)} \tag{3}$$

wherein
R$^1$ is a hydrogen atom or methyl group,
R$^2$ is selected from the group consisting of methyl, ethyl, n-propyl, isopropyl, n-butyl, tert-butyl, and 2-ethylhexyl,
R$^3$ is selected from the group consisting of methyl, ethyl, n-propyl, isopropyl, n-butyl, tert-butyl, 2-ethylhexyl, phenyl, and benzyl, and
R$^4$ is selected from the group consisting of methyl, ethyl, n-propyl, isopropyl, n-butyl, tert-butyl, 2-ethylhexyl, methoxy, and ethoxy; and
   (C) 0.1 to 30 parts by weight of a silane having at least two hydrolysable groups in one molecule, represented by the following formula, and/or its partial hydrolyzate condensate:

$$R_aSiZ_{4-a}$$

wherein
R is an unsubstituted or substituted monovalent hydrocarbon group having 1 to 12 carbon atoms,
Z independently denotes a hydrolyzable group selected from the group consisting of alkoxy groups, alkoxyalkoxy groups, acyloxy groups, alkenyloxy groups, ketoxime groups, amino groups, aminoxy groups, and amide groups, and
a is an integer of 0 to 2.

2. A photocurable organopolysiloxane composition comprising:
   (A) 100 parts by weight of a diorganopolysiloxane having at least two silicon atoms having a hydroxyl group and/or hydrolyzable group attached thereto in one molecule;
   (B) 0.1 to 30 parts by weight of a complex compound, composed of titanium-(meth)acrylate-trialkoxide and b-diketone, represented by formula (3):

$$H_2C=C(R^1)-C(=O)-O-Ti(OR^2)_2 \cdots \text{(complex with } R^3-C(O\cdots)=CH-C(=O\cdots)-R^4 \text{)} \tag{3}$$

wherein
R$^1$ is a hydrogen atom or methyl group,
R$^2$ is selected from the group consisting of methyl, ethyl, n-propyl, isopropyl, n-butyl, tert-butyl, and 2-ethylhexyl,
R$^3$ is selected from the group consisting of methyl, ethyl, n-propyl, isopropyl, n-butyl, tert-butyl, 2-ethylhexyl, phenyl, and benzyl, and
R$^4$ is selected from the group consisting of methyl, ethyl, n-propyl, isopropyl, n-butyl, tert-butyl, 2-ethylhexyl, methoxy, and ethoxy; and
   (D) 0.01 to 5 parts by weight of at least one photoinitiator selected from the group consisting of acetophenone, propiophenone, benzophenone, xanthone, fluoran, benzaldehyde, anthraquinone, triphenylamine, carbazole, 3-methylacetophenone, 4-methylacetophenone, 3-pentylacetophenone, 4-methoxyacetophenone, 2,2-diethoxyacetophenone, 3-bromoacetophenone, 4-allylacetophenone, p-diacetylbenzene, 3-methoxybenzophenone, 4-methylbenzophenone, 4-chlorobenzophenone, 4,4-dimethoxybenzophenone, 4-chloro-4-benzylbenzophenone, 3-chloroxanthone, 3,9-dichloroxanthone, 3-chloro-8-nonylxanthone, benzoin, benzoin methyl ether, benzoin butyl ether, bis(4-dimethylaminophenol)ketone, benzylmethoxyketal, and 2-chlorothioxanthone.

3. The photocurable organopolysiloxane composition of claim 1, wherein the complex compound composed of titanium-(meth)acrylate-trialkoxide and b-diketone of component (B) is a complex compound which is composed of titanium-(meth)acrylate-triisopropoxide and benzoylacetone.

4. The photocurable organopolysiloxane composition of claim 1, wherein component (A) is a diorganopolysiloxane having its molecular chain blocked with hydroxyl groups and/or hydrolyzable groups at both ends.

5. The photocurable organopolysiloxane composition of claim 4 wherein component (A) is a diorganopolysiloxane having the following formula (1) or (2):

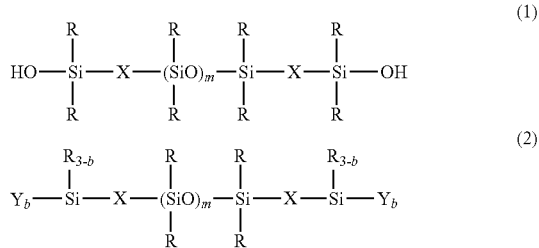

wherein R is an unsubstituted or substituted monovalent hydrocarbon group having 1 to 12 carbon atoms; X is an oxygen atom or a divalent hydrocarbon group having 1 to 8 carbon atoms; Y is a hydrolyzable group; b is 2 or 3; and m is a number satisfying that the diorganopolysiloxane has a viscosity of 100 to 1,000,000 mPa·s at 25° C.

6. The photocurable organopolysiloxane composition of claim 2, wherein the complex compound composed of titanium-(meth)acrylate-trialkoxide and b-diketone of component (B) is a complex compound which is composed of titanium-(meth)acrylate-triisopropoxide and benzoylacetone.

7. The photocurable organopolysiloxane composition of claim 2, wherein component (A) is a diorganopolysiloxane having its molecular chain blocked with hydroxyl groups and/or hydrolyzable groups at both ends.

8. The photocurable organopolysiloxane composition of claim 7 wherein component (A) is a diorganopolysiloxane having the following formula (1) or (2):

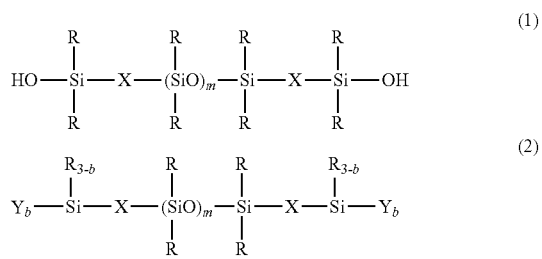

wherein R is an unsubstituted or substituted monovalent hydrocarbon group having 1 to 12 carbon atoms; X is an oxygen atom or a divalent hydrocarbon group having 1 to 8 carbon atoms; Y is a hydrolysable group; b is 2 or 3; and m is a number satisfying that the diorganopolysiloxane has a viscosity of 100 to 1,000,000 mPa·s at 25° C.

9. The photocurable organopolysiloxane composition of claim 1 wherein, in component (B), $R^2$ is ethyl or isopropyl, $R^3$ is methyl or phenyl, and $R^4$ is methyl or ethoxy.

10. The photocurable organopolysiloxane composition of claim 1 wherein, in component (C), Z is an alkoxy group, a ketoxime group, or an alkenyloxy group.

11. The photocurable organopolysiloxane composition of claim 9 wherein, in component (C), Z is an alkoxy group, a ketoxime group, or an alkenyloxy group.

12. The photocurable organopolysiloxane composition of claim 2 wherein, in component (B), $R^2$ is ethyl or isopropyl, $R^3$ is methyl or phenyl, and $R^4$ is methyl or ethoxy.

* * * * *